United States Patent [19]

Sheu et al.

[11] Patent Number: 5,668,481

[45] Date of Patent: Sep. 16, 1997

[54] MULTIPLE PATTERN SEQUENCE GENERATION BASED ON INVERTING NON-LINEAR AUTONOMOUS MACHINE

[75] Inventors: Meng-Lieh Sheu; Chung-Len Lee, both of Hsinchu, Taiwan

[73] Assignee: National Science Council, Taipei, Taiwan

[21] Appl. No.: 393,277

[22] Filed: Feb. 23, 1995

[51] Int. Cl.[6] .......................... H03K 19/00; H03K 19/173
[52] U.S. Cl. ........................... 326/16; 326/38; 371/27.1; 371/25.1
[58] Field of Search .................... 326/38, 39, 16; 371/27, 25.1, 22.1, 22.3

[56] References Cited

U.S. PATENT DOCUMENTS

| | | | |
|---|---|---|---|
| 3,976,864 | 8/1976 | Gordon et al. | 235/153 |
| 4,519,078 | 5/1985 | Komonytsky | 371/27 |
| 4,598,401 | 7/1986 | Whelan | 371/25 |
| 4,601,033 | 7/1986 | Whelan | 371/25 |
| 4,601,034 | 7/1986 | Sridhar | 371/25 |
| 4,817,093 | 3/1989 | Jacobs et al. | 371/25 |
| 5,412,665 | 5/1995 | Gruodis et al. | 371/27 |

*Primary Examiner*—Edward P. Westin
*Assistant Examiner*—Richard Roseen
*Attorney, Agent, or Firm*—Lackenbach Siegel Marzullo Aronson & Greenspan, P.C.

[57] ABSTRACT

A sequence generator for generating multiple-pattern sequences utilizing an inverting non-linear autonomous machine is disclosed. The generation of the sequence is based on the interdependency relationship between the bits of the deterministic patterns in the sequences to be generated. The autonomous machine comprises a number of flip-flop cascades each containing a number of flip-flops. The flip-flops in each of the cascades are connected in a way that the output of one flip-flop is connected to the input of the next flip-flop in each cascade. The autonomous machine further comprises a number of XOR gates each feeding its output to the input of a corresponding one of the cascades of flip-flops. The autonomous machine further comprises a switch device that includes a number of switches for receiving the output of each of the flip-flops in the cascades as feedbacks for outputting to the inputs of the XOR gates. Each of the XOR gates is selectively added with an inverter for inverting its output before connecting to the corresponding one of the cascade of flip-flops. Each of the switches in the switch device is selectively programmed for connecting corresponding one of the feedbacks to the input of the corresponding one of the XOR gates.

6 Claims, 2 Drawing Sheets

MULTIPLE PATTERN SEQUENCE GENERATION BASED ON INVERTING NON-LINEAR AUTONOMOUS MACHINE

BACKGROUND OF THE INVENTION

1. Field of the Invention

The present invention relates in general to multiple-pattern sequence generators based on inverting non-linear autonomous machines. In particular, the present invention relates to multiple-pattern sequence generators based on inverting non-linear autonomous machines, capable of relying on the interdependency between deterministic patterns in a sequence for generating a multiple of patterns in a sequence containing the leading deterministic patterns and followed by pseudo-random patterns. More particularly, the present invention relates to multiple-pattern sequence generators based on inverting non-linear autonomous machines having simplified hardware structural configuration.

2. Technical Background

Sequence generators are widely utilized in digital electronic equipments such as controllers, coders, decoders, and test-pattern generators etc. The principal hardware structural configuration of some of the conventional sequence generators are based on digital counters which enjoy the primary advantage of simplicity in their electronic circuitries. However, they suffer the major limitation in the generation of fixed sequences.

Others of the conventional sequence generator employ finite state machines for the description of the interdependent relationship between the sequences and utilize random logic to construct the circuitry for the generation of the desired sequences. The advantage of this implementation is the ability to generate any specific sequence, but with the obvious disadvantage of the lack of regularity in the constructed circuitries. Such circuitries are also inadequate for the generation of pseudo-random sequences.

Still other conventional sequence generators employ the category of linear feedback shift registers (LFSR) as the primary core for the generation of pseudo-random sequences. Maximum lengths of pseudo-random sequences can be advantageously generated with simple and regular hardware structural configurations. However, the generated sequences are not in arbitrary order, but are restricted by the feedback path in the LFSR's.

Specific deterministic patterns in the generated sequences for practical applications are frequently required to appear as early as possible, or, they may also be required to appear repeatedly, or in specific order in the generated pseudo-random sequences. These conditions are not totally satisfiable with the conventional state-of-the-art and straight-forward LFSR's. With the LFSR being widely employed in the generation of pseudo-random sequences having maximized lengths, reseeding practices of the LFSR's are utilized to change the order of the patterns in the generated sequences, causing the desired pattern to appear as early as possible. Alteration of the feedback paths in the LFSR's can result in the change of the appearing order of the patterns in the generated sequences, thereby generating some of the required specific patterns. However, unless certain stored-pattern procedures are taken to pre-store ordered sequences or specific sequences in memory devices before LFSR's can be used to generate the pseudo-random sequence, current LFSR techniques can only satisfy some of the practical application requirements. Otherwise, instead of simplicity and regularity, huge and complex hardware configuration will be necessary for the generation of the practically arbitrary sequences of repeated and pseudo-random nature.

One important application of multiple-pattern sequence generator is in the testing of very large-scale integrated circuit (VLSI) devices. VLSI technology is advancing rapidly, electronic circuitries with complex functionality and huge scale of integration are being integrated into single IC packages. These VLSI IC packages do not have sufficient lead pins for the arrangement of the connection to external testing equipment for the IC device testing purposes. Internal testing circuitries are therefore included as a portion of the entire IC device for conducting on-board testing from inside the VLSI IC device. This built-in self-test (BIST) technique has being widely accepted not only because it reduces the cost and difficulty of the external testing practice, but also because of its ability to provide the real-time on-line testing of the VLSI device.

In a typical BIST design, a sequence generator is required for the generation of a test sequence containing necessary testing patterns. As is in the case of the above-discussed sequence generators, most BIST sequence generator designs employ LFSR's as the basis for the generation of the test sequences. Several different techniques have been developed for the construction of the test sequence generators of the BIST designs. For example, in the exhaustive testing scheme, all possible input combinations are generated as the test pattern of the BIST-based sequence generator. This scheme, however, is not suitable for circuitries with requiring large amount of inputs.

In another pseudo-exhaustive testing scheme, the electronic circuitry of the BIST test device is partitioned into a number of smaller sub-circuits. Each of the subcircuits performs its own exhaustive testing procedure as in the exhaustive testing scheme described above. This pseudo-exhaustive testing scheme is limited by the fact that it can not generate deterministic sequences or sequences with repeated test patterns. Such limitation prohibits the use of this pseudo-exhaustive testing scheme in sequential circuits or testing schemes concerning delay faults.

In another pseudo-random testing scheme, a pseudo-random pattern generator is utilized to generate the test patterns in sequences. This scheme, however, is restricted in the detection of some random pattern resistant faults, and is neither suitable for use in sequential circuits nor in the testing scheme concerning delay faults.

In still another mixed-mode testing scheme, pseudo-random test patterns are generated first and then certain test patterns of specific arrangement. The hardware structural configuration of this testing scheme, however, requires much more complication.

SUMMARY OF THE INVENTION

It is therefore an object of the present invention to provide a process for generating multiple-pattern sequences employing inverting non-linear autonomous machines based on the interdependency between deterministic patterns in the sequence.

It is another object of the present invention to provide a process for generating multiple-pattern sequences containing deterministic patterns followed by pseudo-random patterns employing inverting non-linear autonomous machines based on the interdependency between deterministic patterns in the sequence.

It is still therefore an object of the present invention to provide a multiple-pattern sequence generator based on an inverting non-linear autonomous machine capable of relying on the interdependency between deterministic patterns in a sequence for generating a multiple of patterns in a sequence containing the leading deterministic patterns and followed by pseudo-random patterns.

It is yet another object of the present invention to provide a multiple-pattern sequence generator based on an inverting non-linear autonomous machine that has the simplest possible hardware structural configuration.

The present invention achieves the above identified object by providing a process for generating multiple-pattern sequences utilizing an inverting non-linear autonomous machine based on the interdependency relationship between the bits of the deterministic patterns in the sequences to be generated. The process comprises the steps of (a), setting up a set of dependent equations describing the interdependency between all bits in the width of each of the deterministic patterns utilizing a set of variables that includes the inversion of the bits in the patterns, and the interdependency of the bits in the patterns; (b), resolving the set of dependent equations into a unique set of solutions expressed by the inversion and interdependency variables; and (c), the inversion and interdependency variable solutions are employed for the selection of addition of inverters to outputs of exclusive-OR (XOR) gates, and the selection of programming of the switches in the switch means respectively.

The present invention achieves the above identified object also by providing a sequence generator for generating multiple-pattern sequences utilizing an inverting non-linear autonomous machine. The generation of the sequence is based on the interdependency relationship between the bits of the deterministic patterns in the sequences to be generated. The autonomous machine comprises a number of flip-flop cascades each containing a number of flip-flops. The flip-flops in each of the cascades are connected in a way that the output of one flip-flop is connected to the input of the next flip-flop in each cascade. The autonomous machine further comprises a number of XOR gates each feeding its output to the input of a corresponding one of the cascades of flip-flops. The autonomous machine further comprises a switch device that includes a number of switches for receiving the output of each of the flip-flops in the cascades as feedbacks for outputting to the inputs of the XOR gates. Each of the XOR gates is selectively added with an inverter for inverting its output before connecting to the corresponding one of the cascade of flip-flops. Each of the switches in the switch device is selectively programmed for connecting corresponding one of the feedbacks to the input of the corresponding one of the XOR gates.

BRIEF DESCRIPTION OF THE DRAWING

Other objects, features and advantages of the present invention will become apparent by way of the following detailed description of the preferred but non-limiting embodiment. The description is made with reference to the accompanied drawings, wherein.

DETAILED DESCRIPTION OF THE PREFERRED EMBODIMENT

Figure 1:
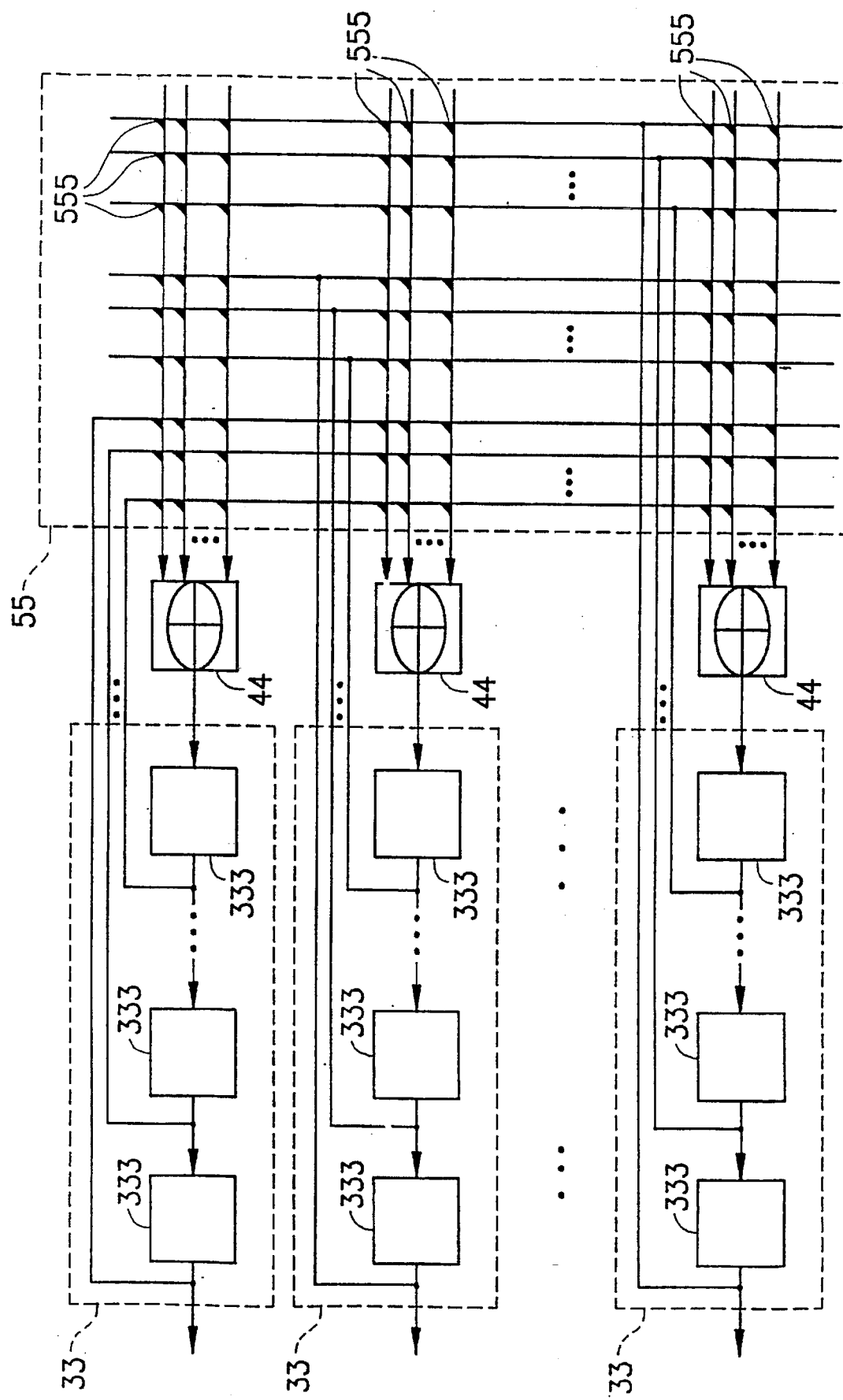
FIG. 1 shows the schematic diagram of a general multiple-pattern sequence generator based on an inverting non-linear autonomous machine in accordance with a preferred embodiment of the present invention.

Refer to FIG. 1 of the drawing. FIG. 1 shows the schematic diagram of a multiple-pattern sequence generator based on the inverting non-linear autonomous machine in accordance with a preferred embodiment of the present invention. The multiple-pattern sequence generator of the present invention, as is shown, comprises a number of feedback shift registers, FSR's 33, a number of inverted and non-inverted XOR gates 44, and a switch device 55.

Each of the FSR's 33 may comprise an inverting non-linear two-dimensional feedback shift registers. For example, the FSR 33 can be consisted of at least one flip-flop 333. In the case of more than one flip-flops 333, all the flip-flops 333 are connected in cascade, each having its output connected to both the input of the flip-flop in the next stage and back to the switch device 55. The input of each of the FSR's 33, namely the input of the first stage of the flip-flop 333 in the cascade, is fed by the output of a corresponding one of the number of inverted/non-inverted XOR gates 44.

Figure 2:
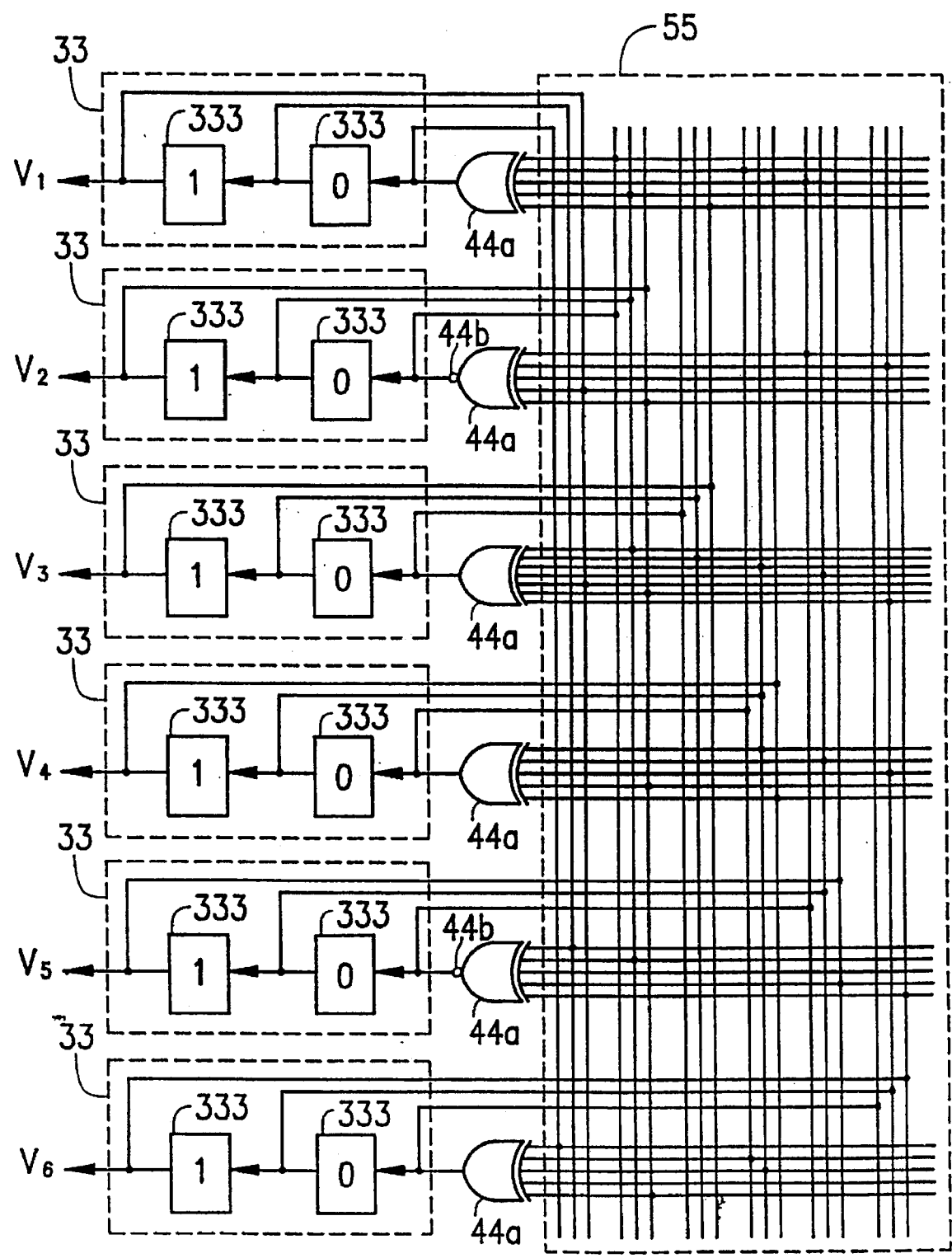
FIG. 2 shows the schematic diagram of a specific multiple-pattern sequence generator based on an inverting non-linear autonomous machine in accordance with an exemplified outline of a deterministic pattern designation.

Each of the inverted/non-inverted XOR gates 44 may be a linear XOR gate 44a, or a linear XOR gate combined by a non-linear inverter 44b, as is shown in FIG. 2, which is to be described later. There is a corresponding number of these inverted/non-inverted XOR gates 44 as there is the number of FSR's 33, and, as is mentioned above, the output of each of these inverted/non-inverted XOR gates 44 is fed to the input of the correspondingly connected FSR 33. The input to each of these inverted/non-inverted XOR gates 44 is, as can be observed in the drawing, connected to the switch device 55.

The switch device 55, which feeds each inputs of the inverted/non-inverted XOR gates 44 and also receives feedbacks from the constituent stages of flip-flops in the FSR's 33, is shown to comprise a grid-work of programmable switches 555. The purpose of the utilization of the switch device 55 is to selectively send the feedback signals of the stages of flip-flop flops in the FSR's 33 back into the inputs of the inverted/non-inverted XOR gates 44 again. The selection of the feedback paths in the switch device 55, which is to be described later in more detail, is based on the interdependency between the deterministic patterns in the sequence to be generated.

The multiple-pattern sequence generator as shown in FIG. 1 generally outlines the hardware structural configuration of a device in accordance with the disclosure of the present invention that can be utilized for the generation of the desired sequences. The object of the present invention, as outlined above, to provide a multiple-pattern sequence generator, capable of implementing the process of the present invention to rely on the interdependency between deterministic patterns in a sequence for generating a multiple of patterns in the sequence containing the leading deterministic patterns and followed by pseudo-random patterns, can be described in other terms. That is, for a given sequence of patterns having a width of N bits and a length of M patterns, a multiple-pattern sequence generator is to be designed based on an inverting non-linear autonomous machine, so as to be able to generate a sequence, containing the first M patterns completely in conformity to the deterministic patterns in the sequence, and followed by the pseudo-random patterns. Moreover, the hardware is required to be of the simplest possible configuration, making use of least possible XOR gates, inverters, and flip-flops.

Thus, in the above-outlined problem, the total of N single-bits in each of the patterns of the sequence can be considered to be independent signals, and may each be generated utilizing one of a total of N independent signal generators, for example, N LFSR's. Basically, it is possible to seek the linear dependency, or inverse linear dependency, between the signals in the patterns. Based on the resolved dependency relationships, it is possible to simplify the configuration of the hardware structure used for the generation of the sequence of patterns. A hardware structure for the multiple-pattern sequence generator requiring the minimum number of XOR gates, inverters, and flip-flops can then be achieved.

A simple example is described below to show that the above-mentioned scheme of seeking the interdependency relationship can substantially be employed to build a sequence generator that is capable of generating a pseudo-random sequence containing the necessary deterministic patterns. For the specified deterministic patterns, a series of shift registers having sufficient length (that is, the length of the deterministic sequence) can be employed to store the entire sequence therein. The shift registers can constitute a random LFSR that is able to generate the pseudo-random patterns followed thereafter by the deterministic patterns. With this minimum length of shift registers, the worst case condition of the multiple-pattern sequence generator can still be met.

In the process of seeking the interdependency of the deterministic patterns in the sequence, a technique of time-frame expansion is employed to gradually increase the length of the cascade of the shift registers in the sequence generator hardware, until the ultimate shift register cascade having the shortest possible length is resolved. The cascade length is increased based on the required delay signals. That is, the shift registers serve to store the individual signals in delay in the cascaded length of the registers, and, further, the delayed signals in the registers can in turn be used again as the new source of incoming signals. When the inverted versions of the signals, as well as of the delayed signals are added into the manipulation of the scheme, the space in which the interdependency is sought is greatly expanded.

Due to the fact that inverting non-linear shift registers allow only the incorporation of linear XOR gate (as well as its inverted version), the above-outlined process of seeking the ultimate shift register cascade can therefore be converted into the problem of resolving non-invertedly signaled binary linear dependent equations and invertedly signaled binary linear dependent equations. The length of the shift register cascade is a parameter dependent on the scale of the dependent equations. The longer the length of the shift register cascade, the more the number of independent signals, and the easier the resolution of the linear dependent equations will become. Therefore, with the resolved interdependency between each of the signals in a pattern and with the delayed signals, the length of the shift register cascade for the sequence generator can be greatly reduced. This is expressed in the following equations:

For a sequence having a length of M patterns and a width of N, if $V_i$ represents the i-th bit sequence in the sequence, then $$V_1: b_{11}b_{12} \ldots b_{1M}$$
$$V_2: b_{21}b_{22} \ldots b_{2M}$$
$$\vdots$$
$$V_N: b_{N1}b_{N2} \ldots b_{NM} \quad b_{ij} \in \{0, 1\}$$

Then, for each $V_i$ ($1 \leq i \leq N$), there exists an m ($0 \leq m \leq M$) such that $V_i$ can be expressed as:

$$V_i(n) = \sum_{j=1}^{N} \sum_{k=0}^{m} a_{ijk} V_j(n) D^k + C_i, \quad n = (m+1) \sim M, \quad (1)$$

wherein $$V_i(n) = b_{in}, \; V_j(n)D^k = b_{jn}D^k = b_{j(n-k)};$$

and $$a_{ijk} \in \{0, 1\}, \; C_i \in \{0, 1\}$$

The condition of $a_{ijk}=1$ signifies the interdependency between $V_i$ and $V_jD^k$, and the condition of $a_{ijk}=0$ otherwise indicates the non-dependency therebetween. Further, the condition of $C_i=1$ indicates that $V_i$ is inverted, and the condition of $C_i=0$ indicates that $V_i$ remains not inverted.

In the equation outlined above, the number m signifies the time-frame expansion index. In the process of a total of m expansions, for every $V_i$ to be resolved, there is (mN+N−1) binary variables $a_{ijk}$, and (M−n) dependent equations. As the number m, that is, the time frame index m increases gradually as the resolution process proceeds, the number of variables increases while the number of dependent equations decreases, and the more likely the dependent equations are going to be resolved into a unique set of solutions. However, the larger the number m is, the more the number of flip-flops in the sequence generator hardware is required. It is therefore essential that the solution to the dependent equations be obtained at the minimum possible m number. The inclusion of the inversion factors by the use of inverters in the hardware in this scheme of solving the dependent equations does not substantially add significant complexity to the hardware involved.

To show the practical feasibility of the above-described scheme of finding the hardware combination for the sequence generator, portions of a set of computer program algorithm implementing this scheme has been included herein for reference. The exemplified algorithm serves to read in the desired patterns in the sequence to be generated and produces the dependent equations of equation (1) listed above, with inverted and non-inverted signal variables. The time-frame expansion scheme as described above is then implemented in the exemplified algorithm to seek to resolve into the preferred set of solutions. Due to the fact that the solution to the dependent equations (1) is not unique, the solution produced by the algorithm, based on the establishment of some guide rules, may be set to be optimized at, for example, a solution with a minimum number of flip-flops required, the solution with a minimum feedback, a solution with a minimum number of XOR gates required, and/or the greatest extent in the generated pseudo-random distribution.

Algorithm Listing 1

Specifically, Algorithm Listing 1 shows the algorithm employing the time-frame expansion scheme for the generation of the dependent equations (1) that describe a targeted deterministic patterns characterized by the essential initial patterns:

```
Find_Linear_Dependency( )
{
    for (time = 0 to M-1) {/*M is the length of the sequence*/
        if (all signals are solved) return FIND
        for (each unsolved signal Vi) {
            Build_Equations;
        }
        if (Solve_Equations(M-time) = SOLVED) {
            mark signal Vi SOLVED;
```

```
        }
    else {
        Build_Inverted_Equations;
        if (Solve_Equations(M-time) = SOLVED) {
            mark signal Vi SOLVED;
        }
    }
    };  /*next time frame*/
}   /*end*/
```

Listing 2

Algorithm Listing 2, on the other hand, shows the algorithm employing a binary relaxation scheme for the solution of the dependent equations:

```
Solve_Equations(M)
{
    if (Order_Equation(M)=0) return SOLVED; /*no equation remains*/
    if (Fetch_Equation(M)=DETERMINED) { /*1-variable equation*/
        if (Variable_Conflict) return UNSOLVED;
        Substitute_into_Equations(M-1);
        return Solve_Equations(M-1);
    }
    else {
        Assign_Variable(0); /*select a variable and assign it 0*/
        Substitute_into_Equations(M)
        if (Solve_Equation(M) = UNSOLVED) {
            Assign Variable(1); /*assign the selected variable 1*/
            Substitute_into_Equations(M);
            return Solve_Equations(M);
        };
        if All_Variable_Assigned return SOLVED;
        return Solve_Equations(M)
    };
}   /*end*/
```

A specific example of the procedure of pursuing the mathematical solution to the dependent equations for the construction of the multiple-pattern sequence generator in accordance with the present invention is described below. The dependent equations, as described above, characterize the interdependency of the binary variables for a targeted deterministic sequence characterized by the essential leading deterministic patterns. Table 1 below shows the listing of this deterministic pattern employed herein as an example, featuring a pattern width N of 6, and a pattern length M of 16:

TABLE 1

|    | 6 | 5 | 4 | 3 | 2 | 1 |
|----|---|---|---|---|---|---|
| 1  | 1 | 0 | 0 | 1 | 0 | 1 |
| 2  | 0 | 0 | 1 | 1 | 1 | 0 |
| 3  | 1 | 1 | 1 | 1 | 1 | 1 |
| 4  | 1 | 1 | 1 | 1 | 0 | 0 |
| 5  | 1 | 1 | 1 | 0 | 1 | 0 |
| 6  | 1 | 0 | 0 | 0 | 0 | 0 |
| 7  | 0 | 1 | 1 | 0 | 0 | 0 |
| 8  | 0 | 0 | 0 | 1 | 1 | 1 |
| 9  | 0 | 0 | 1 | 0 | 1 | 1 |
| 10 | 1 | 1 | 0 | 0 | 0 | 1 |
| 11 | 1 | 0 | 0 | 1 | 0 | 0 |
| 12 | 1 | 1 | 1 | 1 | 0 | 0 |
| 13 | 0 | 0 | 1 | 0 | 0 | 0 |
| 14 | 1 | 1 | 0 | 0 | 0 | 0 |
| 15 | 0 | 1 | 1 | 1 | 1 | 1 |
| 16 | 1 | 1 | 0 | 1 | 0 | 0 |

As described above, an algorithm similar to that shown in Algorithm Listing 1 can be employed to generate a set of dependent equations, and in this example, the set of dependent equations as generated can be listed as follows:

$$V_1=(V_2+V_4+V_5)+V_2D+V_3D^2$$

$$\overline{V_2}=V_5+V_6D+(V_1+V_2)D^2$$

$$V_3=(V_2+V_3+V_4+V_5)D+(V_1+V_2+V_6)D^2$$

$$V_4=(V_4+V_5+V_6)D+(V_2+V_4)D^2$$

$$\overline{V_5}=(V_1+V_2)D+(V_5+V_6)D^2$$

$$V_6=(V_1+V_4)+V_4D+V_2D^2$$

The implementation of an algorithm such as that shown in Algorithm Listing 2 can result in a solution that can be employed to construct a sequence generator shown in FIG. 2 of the accompanied drawing. The hardware configuration as outlined in FIG. 2 can then be utilized to generate the pattern sequence as listed in Table 2 that follows. An inspection to Table 2 reveals the fact that the generated pattern sequence contains a leading 16 patterns that conform to the deterministic pattern as listed in Table 1 above. All patterns following the required deterministic patterns are generated pseudo-random patterns. After a cycle of 1,260 patterns in the generated sequence, the deterministic patterns are repeated again.

TABLE 2

| 1  | 100101 | 45 |    | 001100 |    |    | 001001 |     |     | 000100 |
|----|--------|----|----|--------|----|----|--------|-----|-----|--------|
| 2  | 001110 |    |    | 000000 | 80 | 70 | 001111 |     |     | 010001 |
| 3  | 111111 |    |    | 011001 |    |    | 010011 | 115 |     | 001111 |
| 4  | 111100 |    |    | 000011 |    |    | 011000 |     |     | 001000 |
| 5  | 111010 |    |    | 101000 |    |    | 101010 |     |     | 011101 |
| 6  | 100000 | 50 | 40 | 011111 |    |    | 011010 |     |     | 001110 |
| 7  | 011000 |    |    | 101111 | 85 |    | 110111 |     |     | 110010 |
| 8  | 000111 |    |    | 000100 |    |    | 100010 | 120 | 110 | 000111 |
| 9  | 001011 |    |    | 100010 |    |    | 100000 |     |     | 011010 |
| 10 | 110001 |    |    | 001101 |    |    | 000011 |     |     | 101110 |
| 11 | 100100 | 55 |    | 010010 |    |    | 000010 |     |     | 010000 |
| 12 | 111100 |    |    | 000100 | 90 | 80 | 101111 |     |     | 001100 |
| 13 | 001000 |    |    | 101001 |    |    | 011001 | 125 |     | 001010 |
| 14 | 110000 |    |    | 000101 |    |    | 010100 |     |     | 000011 |
| 15 | 011111 |    |    | 011111 |    |    | 000100 |     |     | 010011 |
| 16 | 110100 | 60 | 50 | 110110 |    |    | 000110 |     |     | 110000 |
|    | 000001 |    |    | 110110 | 95 |    | 100011 |     |     | 101101 |
|    | 000110 |    |    | 001110 |    |    | 010001 | 130 | 120 | 100100 |
|    | 100101 |    |    | 000100 |    |    | 010001 |     |     | 000110 |
| 20 | 100010 |    |    | 010011 |    |    | 011011 |     |     | 110101 |

TABLE 2-continued

| | | | | | | | | | | | | | |
|---|---|---|---|---|---|---|---|---|---|---|---|---|---|
| | 111100 | 65 | | 111000 | | | 000001 | | | 101111 | | | |
| | 100111 | | | 000000 | 100 | 90 | 010001 | | | 010101 | | | |
| | 010110 | | | 111100 | | | 001001 | 135 | | 111101 | | | |
| | 010001 | | | 111111 | | | 111011 | | | 111001 | | | |
| | 010011 | | | 110110 | | | 110000 | | | 100010 | | | |
| | 101100 | 70 | 60 | 100000 | | | 110010 | | | 000110 | | | |
| | 001001 | | | 110000 | 105 | | 100101 | | | 011010 | | | |
| | 110000 | | | 000000 | | | 000111 | 140 | 130 | 001001 | | | |
| | 111000 | | | 110101 | | | 000000 | | | 011011 | | | |
| 30 | 111111 | | | 000000 | | | 111001 | | | 011010 | | | |
| | 010111 | 75 | | 110011 | | | 101001 | | | 010100 | | | |
| | 011000 | | | 110011 | 110 | 100 | 001110 | | | 101101 | | | |
| | 001011 | | | 011110 | | | 010111 | 145 | | 010011 | | | |
| | 100010 | | | 001111 | | | 111011 | | | 000000 | | | |
| | 001010 | | | 100011 | | | 000111 | | | 100111 | | | |
| | 101011 | | | 110111 | | | 100110 | | | 000110 | | | |
| | 010100 | | | 001000 | | | 100000 | | | 011100 | | | |
| 140 | 001110 | | | 010000 | | | 100010 | | | 111010 | | | |
| | 011100 | 55 | 190 | 110101 | 105 | | 111010 | 155 | | 110110 | | | |
| | 110011 | | | 010010 | | 240 | 010100 | | | 100110 | | | |
| | 001001 | | | 001001 | | | | | | 000011 | | | |
| | 100011 | | | 010010 | | | | | | 101101 | | | |
| | 010000 | | | 100101 | | | 111011 | | | 001001 | | | |
| | 000011 | 60 | | 010001 | 110 | | 101101 | 160 | 290 | 010111 | | | |
| | 000110 | | | 111110 | | | 000100 | | | 110011 | | | |
| | 101011 | | | 111101 | | | 101100 | | | 101001 | | | |
| | 111100 | | | 001111 | | | 010011 | | | 001001 | | | |
| 150 | 001001 | | | 110110 | | | 100111 | | | 110110 | | | |
| | 100010 | 65 | 200 | 100100 | 115 | | 000001 | 165 | | 001011 | | | |
| | 000010 | | | | | | 111101 | | | 010010 | | | |
| | 011110 | | | 110100 | | | 001010 | | | 101011 | | | |
| | 101100 | | | 100101 | | 250 | 100000 | | | 001111 | | | |
| | 000110 | | | 101000 | | | 011100 | | | 001011 | | | |
| | 111100 | 70 | | 100110 | 120 | | 000011 | 170 | 300 | 111000 | | | |
| | 010000 | | | 110111 | | | 101110 | | | 011011 | | | |
| | 010000 | | | 001110 | | | 101100 | | | 111001 | | | |
| | 101110 | | | 100011 | | | 000010 | | | 011011 | | | |
| 160 | 010111 | | | 011000 | | | 111000 | | | 011110 | | | |
| | | 75 | | 101110 | 125 | | 110101 | 175 | | 010000 | | | |
| | 101101 | | 210 | 011110 | | | 001101 | | | 001000 | | | |
| | 111010 | | | 010010 | | | 001000 | | | 001110 | | | |
| | 010101 | | | 111111 | | 260 | 010011 | | | 100110 | | | |
| | 101001 | | | 000110 | | | 010000 | | | 001110 | | | |
| | 110000 | 80 | | 000111 | 130 | | 000111 | 180 | 310 | 010110 | | | |
| | 101110 | | | 111111 | | | 000010 | | | 101001 | | | |
| | 000001 | | | 010010 | | | 001110 | | | 011001 | | | |
| | 010011 | | | 001110 | | | 100001 | | | 111011 | | | |
| | 111110 | | | 110011 | | | 101111 | | | 100010 | | | |
| 170 | 110011 | 85 | | 010101 | 135 | | 100110 | 185 | | 001000 | | | |
| | 010001 | | 220 | 000111 | | | 111111 | | | 000100 | | | |
| | 000011 | | | 000100 | | | 100011 | | | 111100 | | | |
| | 100001 | | | 111101 | | 270 | 111011 | | | 011110 | | | |
| | 100000 | | | 001100 | | | 100001 | | | 001110 | | | |
| | 101010 | 90 | | 010011 | 140 | | 101101 | 190 | 320 | 011011 | | | |
| | 010111 | | | 110001 | | | 010001 | | | | | | |
| | 001100 | | | 111111 | | | 110111 | | | | | | |
| | 000010 | | | 111001 | | | 000010 | | | 010010 | | | |
| | 101110 | | | 101100 | | | 001010 | | | 111001 | | | |
| 180 | 001011 | 95 | | 011000 | 145 | | 100101 | 195 | | 110101 | | | |
| | 001001 | | 230 | 101111 | | | 001010 | | | 101010 | | | |
| | 101110 | | | 001100 | | | 111011 | | | 000011 | | | |
| | 101011 | | | 001111 | | 280 | 011001 | | | 000101 | | | |
| | 100011 | | | 010101 | | | | | | 001110 | | | |
| | 001000 | 100 | | 101011 | 150 | | | | 200 | 101001 | | | |
| | 000010 | | | 010100 | | | 011100 | | | 001100 | | | |
| 330 | 111110 | | | 110010 | | | 110001 | | | 001000 | | | |
| | 000110 | | 380 | 010010 | | | 111110 | | | 110100 | | | |
| | 100000 | | | 000001 | | 430 | 101011 | | | 011011 | | | |
| | 110100 | 55 | | 111111 | 105 | | 110001 | 155 | 480 | 010001 | | | |
| | 000100 | | | 111101 | | | 110010 | | | | | | |
| | 010000 | | | 101000 | | | 000010 | | | 011100 | | | |
| | 011101 | | | 111101 | | | 001100 | | | 100000 | | | |
| | 010101 | | | 110010 | | | 010110 | | | 100001 | | | |
| | 110111 | 60 | | 101010 | 110 | | 100111 | 160 | | 011111 | | | |
| | 100011 | | | 001011 | | | 000111 | | | 000001 | | | |
| 340 | 110010 | | | 101000 | | | 001110 | | | 110000 | | | |
| | 011110 | | 390 | 010110 | | | 100111 | | | 110001 | | | |
| | 101000 | | | 010000 | | 440 | 011100 | | | 000000 | | | |
| | 000010 | 65 | | 000001 | 115 | | | 165 | | 010010 | | | |

TABLE 2-continued

| | | | | | | | |
|---|---|---|---|---|---|---|---|
| | 011001 | | 110001 | | 001011 | 490 | 001011 |
| | 001101 | | 100011 | | 000011 | | 100101 |
| | 110110 | | 011101 | | 110100 | | 101101 |
| | 101010 | | 111000 | | 111011 | | 110000 |
| | 101010 | 70 | 100110 | 120 | 111011 | 170 | 001111 |
| | 010000 | | 100101 | | 111010 | | 111001 |
| 350 | 101101 | | 110100 | | 101000 | | 101000 |
| | 110010 | 400 | 000010 | | 110101 | | 011100 |
| | 111000 | | | | 011111 | | 001010 |
| | 110001 | 75 | 100011 | 125 | 450 | 110010 | 175 | 010001 |
| | 001001 | | 110000 | | 110010 | 500 | 101001 |
| | 101101 | | 101001 | | 101011 | | 010001 |
| | 001110 | | 100000 | | 011001 | | 010110 |
| | 110110 | | 100011 | | 110101 | | 111010 |
| | 000011 | 80 | 101000 | 130 | 111100 | 180 | 110001 |
| | 111111 | | 001001 | | 111101 | | 000111 |
| 360 | 110011 | | 010001 | | 000001 | | 110011 |
| | | | 000000 | | 101000 | | 111011 |
| | 110110 | 410 | 000100 | | 010001 | | 110011 |
| | 001000 | 85 | 110101 | 135 | 460 | 110001 | 185 | 010111 |
| | 110111 | | 100001 | | 110001 | 510 | 110000 |
| | 111110 | | 001011 | | 100111 | | 001100 |
| | 000100 | | 001000 | | 011001 | | 011100 |
| | 010111 | | 111100 | | 011101 | | 111101 |
| | 111100 | 90 | 110110 | 140 | 111011 | 190 | 010111 |
| | 100101 | | 001001 | | 000011 | | 010110 |
| | 100001 | | 100101 | | 110000 | | 010101 |
| 370 | 011001 | | 100011 | | 111111 | | 010111 |
| | 110010 | 420 | 101110 | | 011110 | | 001001 |
| | 011101 | 95 | 111010 | 145 | 470 | 100111 | 195 | 010100 |
| | 001101 | | 111100 | | 001110 | 520 | 010110 |
| | 010111 | | 111100 | | 110001 | | |
| | 010010 | | 010011 | | 100010 | | 111100 |
| | 010001 | | 110101 | | 001111 | | 000010 |
| | 110010 | 100 | 111011 | 150 | 100101 | 200 | 101010 |
| | 001111 | | 111111 | | 101111 | | 111100 |
| | 101100 | | 101001 | | 010100 | | 010111 |
| | 110011 | | 100001 | | 101111 | | 110001 |
| | 001101 | | 110001 | | 100100 | | 011110 |
| | 100111 | 55 | 110101 | 105 | 001000 | 155 | 000001 |
| | 110101 | | 100011 | | 101011 | | 010111 |
| 530 | 011110 | | 111100 | | 011010 | | 111010 |
| | 100000 | 580 | 000000 | | 010000 | | 010110 |
| | 101111 | | 011101 | | 101001 | | 001100 |
| | 000001 | 60 | 000111 | 110 | 630 | 110110 | 160 | 680 | 100101 |
| | 110100 | | 001101 | | 011101 | | |
| | 110101 | | 000010 | | 101100 | | 100101 |
| | 100101 | | 001001 | | 101111 | | 011101 |
| | 001111 | | 000000 | | 101001 | | 010111 |
| | 101101 | 65 | 011111 | 115 | 110011 | 165 | 000000 |
| | 100001 | | 110000 | | 001011 | | 101011 |
| 540 | 010000 | | 000101 | | 010100 | | 010011 |
| | 001101 | 590 | 100011 | | 011000 | | 101111 |
| | 011000 | | 111000 | 640 | 100010 | | 101100 |
| | 011110 | 70 | 000100 | 120 | | 170 | 100101 |
| | 111001 | | 111000 | | 110111 | 690 | 110011 |
| | 011101 | | 011010 | | 101111 | | 100011 |
| | 101101 | | 101011 | | 011011 | | 010011 |
| | 111101 | | 000110 | | 100011 | | 100110 |
| | 110100 | 75 | 110100 | 125 | 001100 | 175 | 010011 |
| | 011001 | | 111101 | | 100111 | | 100000 |
| 550 | 100110 | | 001000 | | 010010 | | 100000 |
| | 010100 | 600 | | | 010101 | | 001101 |
| | 000001 | | | | 110110 | | 011100 |
| | 010000 | 80 | 010100 | 130 | 650 | 110001 | 180 | 011010 |
| | 011011 | | 100010 | | 101111 | 700 | 011100 |
| | 100110 | | 011111 | | 110100 | | 000000 |
| | 011010 | | 101000 | | 000101 | | 001011 |
| | 011111 | | 100101 | | 000010 | | 111001 |
| | 100101 | 85 | 010010 | 135 | 000000 | 185 | 001001 |
| | 011110 | | 011011 | | 111111 | | 100100 |
| 560 | 110010 | | 101000 | | 011010 | | 110001 |
| | | | 000100 | | 100011 | | 110011 |
| | 010101 | 610 | 101010 | | 101011 | | 010000 |
| | 100000 | 90 | 100000 | 140 | 660 | 101100 | 190 | 010001 |
| | 001111 | | 001010 | | 000100 | 710 | 111100 |
| | 101011 | | 111101 | | 001011 | | 001010 |
| | 010010 | | 101010 | | 011000 | | 000111 |
| | 111101 | | 001010 | | 110001 | | 010111 |

TABLE 2-continued

| | | | | | | | | | | |
|---|---|---|---|---|---|---|---|---|---|---|
| | 110001 | 95 | | 111010 | 145 | | 011111 | 195 | | 010101 |
| | 001111 | | | 001011 | | | 010011 | | | 110000 |
| | 011110 | | | 111010 | | | 001010 | | | 000010 |
| 570 | 100011 | | | 101100 | | | 010000 | | | 000010 |
| | 001010 | | 620 | 110001 | | | 111011 | | | 001000 |
| | 010100 | 100 | | 111010 | 150 | 670 | 001100 | 200 | | 010010 |
| 720 | 000010 | | | 111000 | | | 100100 | | | 110101 |
| | | | | 000111 | | | 011011 | | | 110011 |
| | 011010 | | 770 | 011101 | | | 000011 | | | 110001 |
| | 101000 | | | 001111 | | 820 | 100110 | | | 101001 |
| | 100011 | 55 | | 100000 | 105 | | 000001 | 155 | 870 | 000111 |
| | 100001 | | | 011010 | | | 011010 | | | 101000 |
| | 110110 | | | 110000 | | | 000001 | | | 111110 |
| | 010100 | | | 000011 | | | 110110 | | | 010111 |
| | 010011 | | | 010000 | | | 000010 | | | 111111 |
| | 101010 | 60 | | 010101 | 110 | | 101101 | 160 | | 000000 |
| | 111010 | | | 111000 | | | 101110 | | | 110100 |
| | 011101 | | | 101111 | | | 011100 | | | 010010 |
| 730 | 000100 | | 780 | 011010 | | | 100101 | | | 101110 |
| | 101000 | | | 110001 | | 830 | 110111 | | | 011001 |
| | 010111 | 65 | | 010001 | 115 | | 100111 | 165 | 880 | 110011 |
| | 000010 | | | 001101 | | | 110110 | | | |
| | 011100 | | | 111111 | | | 111011 | | | 001111 |
| | 011011 | | | 010101 | | | 110101 | | | 010000 |
| | 001110 | | | 101111 | | | 100100 | | | 111101 |
| | 011101 | 70 | | 000011 | 120 | | 011101 | 170 | | 111111 |
| | 100001 | | | 000011 | | | 110000 | | | 010001 |
| | 010100 | | | 111101 | | | 001011 | | | 101011 |
| 740 | 001001 | | 790 | 000100 | | | 111101 | | | 100110 |
| | 111101 | | | 111110 | | 840 | 001101 | | | 011110 |
| | 000011 | 75 | | 101001 | 125 | | | 175 | | 011011 |
| | 011111 | | | 000110 | | | 000001 | | 890 | 000000 |
| | 011001 | | | 111010 | | | 101100 | | | 000011 |
| | 010000 | | | 100011 | | | 010101 | | | 010100 |
| | 000000 | | | 111101 | | | 010100 | | | 010001 |
| 750 | 100011 | 80 | | 010010 | 130 | | 101100 | 180 | | 011101 |
| | 111110 | | | 000000 | | | 000001 | | | 110010 |
| | 110111 | | | 101101 | | | 011101 | | | 111100 |
| | 010101 | | 800 | 100000 | | | 100000 | | | 110101 |
| | 100110 | | | | | | 000110 | | | 101100 |
| | 111100 | 85 | | 000010 | 135 | 850 | 010100 | 185 | | 110000 |
| | 000110 | | | 010000 | | | 010111 | | 900 | 101000 |
| | 101110 | | | 110010 | | | 101110 | | | 110010 |
| | 101010 | | | 110011 | | | 011111 | | | 111110 |
| | 110001 | | | 111001 | | | 000000 | | | 000010 |
| | 010101 | 90 | | 000100 | 140 | | 100010 | 190 | | 100100 |
| | 001001 | | | 011111 | | | 101100 | | | 010001 |
| 760 | 011010 | | | 010001 | | | 101010 | | | 011001 |
| | | | | 111101 | | | 111111 | | | 110110 |
| | 001000 | | 810 | 011000 | | | 001011 | | | 011001 |
| | 001001 | 95 | | 011010 | 145 | 860 | 111100 | 195 | | 101000 |
| | 000111 | | | 111101 | | | 011111 | | 910 | 001010 |
| | 111110 | | | 111000 | | | 011100 | | | 110100 |
| | 000000 | | | 110000 | | | 000110 | | | 010101 |
| | 010011 | | | 011011 | | | 111000 | | | 001111 |
| | 011001 | 100 | | 110000 | 150 | | 010100 | 200 | | 101001 |
| | 100101 | | | 100111 | | | 101100 | | | 100010 |
| | 110101 | | | 010111 | | | 101110 | | | 100001 |
| | 010000 | | | 000011 | | | 111011 | | | 010001 |
| | 111110 | | | 001110 | | | 101110 | | | 011111 |
| | 011010 | 55 | | 000110 | 105 | | 100001 | 155 | | 000101 |
| 920 | 000100 | | | 100100 | | | 111001 | | | 110100 |
| | | | | 110000 | | | 011100 | | | 010100 |
| | 100000 | | 970 | 100001 | | | 111011 | | | 011101 |
| | 111010 | | | 001101 | | 1020 | 000101 | | | 110100 |
| | 011010 | 60 | | 111011 | 110 | | 000011 | 160 | 1070 | 001111 |
| | 100101 | | | 010001 | | | 010010 | | | 011000 |
| | 011000 | | | 001010 | | | 100010 | | | 010000 |
| | 000001 | | | 011110 | | | 110000 | | | 100111 |
| | 111000 | | | 100101 | | | 001110 | | | 101000 |
| | 011100 | 65 | | 111001 | 115 | | 101011 | 165 | | 101000 |
| | 011000 | | | 111001 | | | 110101 | | | 101001 |
| 930 | 101011 | | | 000011 | | | 110110 | | | 111011 |
| | 001000 | | 980 | 111110 | | | 100111 | | | 100110 |
| | 101010 | | | 100001 | | 1030 | 010001 | | | 001100 |
| | 001000 | 70 | | 101011 | 120 | | 110000 | 170 | 1080 | 100001 |
| | 001101 | | | 100010 | | | 100011 | | | |
| | 000011 | | | 011010 | | | 111010 | | | |
| | 011011 | | | 111110 | | | 110011 | | | 100001 |

TABLE 2-continued

| idx | code | step | idx | code | step | idx | code | step | idx | code | step |
|---|---|---|---|---|---|---|---|---|---|---|---|
|  | 011101 |  |  | 011101 |  |  | 110000 |  |  | 111000 |  |
|  | 110101 | 75 |  | 100101 | 125 |  | 111011 | 175 |  | 001010 |  |
|  | 011101 |  |  | 010000 |  |  | 011010 |  |  | 100110 |  |
| 940 | 000101 |  |  | 101100 |  |  | 000010 |  |  | 101111 |  |
|  | 111010 |  | 990 | 100000 |  |  | 010011 |  |  | 101110 |  |
|  | 001010 |  |  | 100101 |  | 1040 | 010111 |  |  | 010010 |  |
|  | 101000 | 80 |  | 011011 | 130 |  |  | 180 |  | 111011 |  |
|  | 110001 |  |  | 100100 |  |  | 100110 |  |  | 000010 |  |
|  | 011011 |  |  | 101101 |  |  | 110010 |  | 1090 | 100010 |  |
|  | 010111 |  |  | 010111 |  |  | 011000 |  |  | 100010 |  |
|  | 101111 |  |  | 000100 |  |  | 011011 |  |  | 110100 |  |
|  | 001101 | 85 |  | 101111 | 135 |  | 101111 | 185 |  | 001010 |  |
|  | 011101 |  |  | 110110 |  |  | 100101 |  |  | 001110 |  |
| 950 | 001000 |  |  | 110010 |  |  | 011010 |  |  | 101000 |  |
|  | 000001 |  | 1000 | 001010 |  |  | 110110 |  |  | 010000 |  |
|  | 101010 |  |  |  |  |  | 110000 |  |  | 100011 |  |
|  | 100110 | 90 |  | 100001 | 140 |  | 111101 | 190 |  | 101100 |  |
|  | 111001 |  |  | 001110 |  |  | 101001 |  |  | 001101 |  |
|  | 010000 |  |  | 011110 |  |  | 101111 |  | 1100 | 110100 |  |
|  | 010110 |  |  | 000100 |  |  | 101111 |  |  | 011101 |  |
|  | 011101 |  |  | 000001 |  |  | 000000 |  |  | 100010 |  |
|  | 111010 | 95 |  | 000010 | 145 |  | 100110 | 195 |  | 110001 |  |
|  | 010001 |  |  | 100001 |  |  | 101000 |  |  | 011100 |  |
| 960 | 101101 |  |  | 000111 |  |  | 001111 |  |  | 110110 |  |
|  |  |  |  | 100001 |  |  | 100010 |  |  | 011111 |  |
|  | 010101 |  |  | 000001 |  |  | 101101 |  |  | 011011 |  |
|  | 110011 | 100 |  | 010010 | 150 | 1060 | 111000 | 200 |  | 100111 |  |
|  | 001000 |  |  | 110100 |  |  | 100010 |  |  | 110111 |  |
| 1110 | 000010 |  |  | 100110 |  |  | 100110 |  |  | 011011 |  |
|  | 001111 |  | 1160 | 001101 |  |  | 110000 |  |  | 111000 |  |
|  | 110011 |  |  |  |  |  | 101111 |  |  | 001001 |  |
|  | 110010 | 55 |  | 110011 | 105 | 1210 | 010011 | 155 |  | 000011 |  |
|  | 001100 |  |  | 111100 |  |  | 001110 |  | 1260 | 111010 |  |
|  | 010010 |  |  | 010010 |  |  | 010100 |  | 1 | 100101 |  |
|  | 100011 |  |  | 100111 |  |  | 011110 |  | 2 | 001110 |  |
|  | 100010 |  |  | 100110 |  |  | 010001 |  |  |  |  |
|  | 010011 | 60 |  | 110110 | 110 |  | 011010 | 160 |  |  |  |
|  | 000001 |  |  | 011100 |  |  | 010011 |  |  |  |  |
| 1120 | 011000 |  |  | 111110 |  |  | 001100 |  |  |  |  |
|  |  |  |  | 110010 |  |  | 100011 |  |  |  |  |
|  | 110110 |  | 1170 | 000011 |  |  | 010110 |  |  |  |  |
|  | 111110 | 65 |  | 011110 | 115 | 1220 | 11000 |  |  |  |  |
|  | 100011 |  |  | 001011 |  |  | 101011 |  |  |  |  |
|  | 011100 |  |  | 001101 |  |  | 010111 |  |  |  |  |
|  | 101010 |  |  | 101010 |  |  | 101011 |  |  |  |  |
|  | 111011 |  |  | 001110 |  |  | 001001 |  |  |  |  |
|  | 001111 | 70 |  | 111110 | 120 |  | 111000 |  |  |  |  |
|  | 011001 |  |  | 101110 |  |  | 010101 |  |  |  |  |
|  | 000010 |  |  | 100111 |  |  | 100111 |  |  |  |  |
| 1130 | 111010 |  |  | 001010 |  |  | 101110 |  |  |  |  |
|  | 000010 |  | 1180 | 110101 |  |  | 011011 |  |  |  |  |
|  | 000101 | 75 |  | 000111 | 125 | 1230 | 000100 |  |  |  |  |
|  | 101001 |  |  | 010010 |  |  | 000111 |  |  |  |  |
|  | 100010 |  |  | 000011 |  |  | 110001 |  |  |  |  |
|  | 010100 |  |  | 001000 |  |  | 001100 |  |  |  |  |
|  | 100000 |  |  | 110101 |  |  | 111011 |  |  |  |  |
|  | 101000 | 80 |  | 001001 | 130 |  | 110110 |  |  |  |  |
|  | 100000 |  |  | 001100 |  |  | 000001 |  |  |  |  |
|  | 000100 |  |  | 110110 |  |  | 001000 |  |  |  |  |
| 1140 | 100011 |  |  | 001101 |  |  | 111011 |  |  |  |  |
|  | 011111 |  | 1190 | 100001 |  |  | 010111 |  |  |  |  |
|  | 001111 | 85 |  | 000110 | 135 | 1240 | 111001 |  |  |  |  |
|  | 101110 |  |  | 110011 |  |  |  |  |  |  |  |
|  | 000100 |  |  | 011100 |  |  | 110011 |  |  |  |  |
|  | 000101 |  |  | 111000 |  |  | 011001 |  |  |  |  |
|  | 000110 |  |  | 000001 |  |  | 101110 |  |  |  |  |
|  | 000100 | 90 |  | 101110 | 140 |  | 111001 |  |  |  |  |
|  | 011010 |  |  | 100010 |  |  | 011001 |  |  |  |  |
|  | 000111 |  |  | 011100 |  |  | 101001 |  |  |  |  |
| 1150 | 000101 |  |  | 001101 |  |  | 011000 |  |  |  |  |
|  | 101111 |  | 1200 | 110000 |  |  | 101001 |  |  |  |  |
|  | 010001 | 95 |  |  | 145 |  | 111111 |  |  |  |  |
|  | 111001 |  |  | 011001 |  | 1250 | 100010 |  |  |  |  |
|  | 011100 |  |  | 000111 |  |  | 101001 |  |  |  |  |
|  | 111111 |  |  | 101100 |  |  | 111100 |  |  |  |  |
|  | 100000 |  |  | 111010 |  |  | 000111 |  |  |  |  |
|  | 011110 | 100 |  | 110010 | 150 |  | 111100 |  |  |  |  |

Thus, for a specifically required deterministic pattern, the present invention makes use of a cascade of inverting non-linear feedback shift registers (namely the inverting non-linear autonomous machine) to constitute a sequence generator capable of generating a sequence of patterns containing a leading deterministic pattern and followed by the pseudo-random patterns of designated length. The constituent registers in the cascade can be selected in accordance with the solution to a set of dependent equations describing the interdependency between the patterns of the deterministic sequence.

The utilization of the time-frame expansion scheme (delayed signaling) allows for the set up of the set of dependent equations, and the implementation of schemes such as binary relaxation allows for the resolution of the dependent equations for an optimized set of solution that can be based to construct the cascade. The constructed cascade of shift registers for the sequence generator constitutes an inverting non-linear autonomous machine that is typically characterized by its simplification and regularity in structural configuration.

The incorporation of the delay signaling and inverse signaling in the set up of the dependent equations allows easily for the close connection of the number of shift registers in a feedback path of selected XOR gates. This establishment of closely-connected shift registers and XOR gates makes it possible to construct the desired sequence generator based on the minimum possible hardware configuration.

As persons skilled in this art can appreciate, the multiple-pattern sequence generator built in accordance with the present invention is suitable for a number of applications. These include the pattern generator for high efficiency built-in self-test sections of VLSI IC devices, coders and decoders as well as compression and decompression sections for digital signal processing equipments. Within the realm of these applications, the sequence generator of the present invention can be constructed to generate test patterns that can verify faults difficult to be pin-pointed by the conventional BIST designs in sequential circuits. With the utilization of the sequence generator of the present invention, memory devices required for the storage of large amount of test patterns can be eliminated to further reduce the overall cost involved in the fault testing procedures.

The above-described preferred embodiments of the present invention is utilized only for the purpose of the description of the present invention. Persons skilled in this art can appreciate the fact that other similar arrangements can be devised from the embodiments disclosed above without departing from the spirit of the present invention, which is recited in the claims that follow.

We claim:

1. A process for generating multiple-pattern sequences utilizing an inverting non-linear autonomous machine based on the interdependency relationship between M deterministic patterns each having a width of N bits in said sequences, said autonomous machine comprising a plurality of flip-flop cascades each containing a plurality of said flip-flops, a plurality of XOR gates each feeding output thereof to the input of a corresponding cascade of flip-flops, and a switch means including a plurality of switches for receiving each output of said flip-flops in said cascades as feedbacks for outputting to the inputs of said plurality of XOR gates, said process comprising the steps of:

(a) setting up a set of dependent equations describing the interdependency between all bits in the width of each of said deterministic patterns utilizing a set of variables including the inversion of the bits in said patterns, and the interdependency of the bits in said patterns;

(b) resolving said set of dependent equations into a unique set of solutions expressed by said inversion and interdependency variables; and (c) said inversion and interdependency variable solutions being employed for the selection of addition of inverters to outputs of said XOR gates, and the selection of programming of said switches in said switch means respectively.

2. The process for generating multiple-pattern sequences of claim 1, wherein step (a) comprises implementing a time-frame expansion scheme for setting up said set of dependent equations.

3. The process for generating multiple-pattern sequences of claim 1, wherein step (b) comprises implementing a binary relaxation scheme for resolving said solution of said set of dependent equations.

4. A sequence generator for generating multiple-pattern sequences utilizing an inverting non-linear autonomous machine based on the interdependency relationship between M deterministic patterns each having a width of N bits in said sequences, said autonomous machine comprising:

a plurality of flip-flop cascades each containing a plurality of flip-flops, said flip-flops in each of said cascades being connected with the output of one flip-flop connected to the input of the next flip-flop in said each cascade;

a plurality of XOR gates each feeding output thereof to the input of a corresponding one of said cascades of flip-flops; and a switch means including a plurality of switches for receiving the output of each of said flip-flops in said cascades as feedbacks for outputting to the inputs of said plurality of XOR gates;

wherein each of said XOR gates being selectively added with an inverter for inverting output thereof before connecting to said corresponding one of said cascade of flip-flops, and each of said switches in said switch means being selectively programmed for connecting corresponding one of said feedbacks to the input of the corresponding one of said XOR gates.

5. The sequence generator for generating multiple-pattern sequences of claim 4, wherein each of said cascades of flip-flops contains at least one flip-flop.

6. The sequence generator for generating multiple-pattern sequences of claim 4, wherein said switch means comprises a grid-work of programmable switches.

* * * * *